(12) United States Patent
Bae

(10) Patent No.: US 7,649,389 B2
(45) Date of Patent: Jan. 19, 2010

(54) DELAY LOCKED LOOP CIRCUIT, SEMICONDUCTOR DEVICE HAVING THE SAME AND METHOD OF CONTROLLING THE SAME

(75) Inventor: Seung-Jun Bae, Daegu (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 117 days.

(21) Appl. No.: 11/978,636

(22) Filed: Oct. 30, 2007

(65) Prior Publication Data

US 2008/0100357 A1  May 1, 2008

(30) Foreign Application Priority Data

Oct. 30, 2006 (KR) ............. 10-2006-0105479

(51) Int. Cl.
*H03L 7/06* (2006.01)
(52) U.S. Cl. ............... 327/158; 327/149; 327/153; 327/161
(58) Field of Classification Search ......... 327/146, 327/147, 149, 152–156, 158, 161–163
See application file for complete search history.

(56) References Cited

U.S. PATENT DOCUMENTS

| 6,385,126 B2* | 5/2002 | Jung et al. ......... 365/233.11 |
|---|---|---|
| 6,445,231 B1 | 9/2002 | Baker et al. |
| 6,791,360 B2* | 9/2004 | Gauthier et al. ......... 326/93 |
| 6,812,760 B1 | 11/2004 | Kim et al. |
| 6,868,504 B1* | 3/2005 | Lin ............... 713/500 |
| 6,919,745 B2 | 7/2005 | Lee et al. |
| 7,161,398 B2* | 1/2007 | Park et al. ......... 327/149 |

FOREIGN PATENT DOCUMENTS

| JP | 2005-243168 | 9/2005 |
|---|---|---|
| KR | 10-2002-0040941 | 5/2002 |
| KR | 10-2003-0013652 | 2/2003 |

\* cited by examiner

*Primary Examiner*—Lincoln Donovan
*Assistant Examiner*—Patrick O'Neill
(74) *Attorney, Agent, or Firm*—Lee & Morse, P.c.

(57) ABSTRACT

A delay locked loop (DLL) circuit includes a basic loop, a coarse loop, a delay model and a fine loop. The basic loop generates a plurality of first clock signals, based at least in part on an input clock signal, a feedback clock signal and a fine loop output signal. The first clock signals respectively have a phase difference. The coarse loop generates a plurality of output clock signals, based at least in part on the input clock signal, the feedback clock signal and the first clock signals. The plurality of output clock signals respectively have a phase difference. The delay model generates the feedback clock signal by delaying one of the output clock signals by a first time period. The fine loop generates the fine loop output signal, based at least in part on the input clock signal and the feedback clock signal.

22 Claims, 10 Drawing Sheets

DELAY LOCKED LOOP CIRCUIT, SEMICONDUCTOR DEVICE HAVING THE SAME AND METHOD OF CONTROLLING THE SAME

BACKGROUND OF THE INVENTION

1. Field of the Invention

Embodiments relate to a delay locked loop (DLL) circuit, a semiconductor device employing a DLL circuit and a method of controlling a DLL circuit. In particular, embodiments relate to a DLL circuit configured to generate multi-phase clock signals, a semiconductor device employing the DLL circuit and a method of controlling the DLL circuit.

2. Description of the Related Art

In general, a delay locked loop (DLL) circuit may be employed in a semiconductor integrated circuit so as to generate an internal clock signal. Typically, in a DLL circuit, an internal clock signal is generated by delaying a system clock signal or an external clock signal by a predetermined delay time. The DLL circuit detects phases of an internal clock signal and an external clock signal, and controls a delay time by a shift operation so as to synchronize the internal clock signal with the external clock signal.

In a semiconductor memory device, such as a dynamic random access memory (DRAM), an internal clock signal generated by a DLL circuit is employed as a timing signal for operating the semiconductor memory device. For example, in a semiconductor memory device, an internal clock signal may be used as a clock signal to output data from the semiconductor memory device and to store data in the semiconductor memory device.

Generally, when memory cells are activated or when memory cells are accessed during a read mode, additional current from an internal supply voltage may be required. The change in demand of current from the internal supply voltage may change a voltage provided to a DLL circuit. The change of the voltage provided to the DLL circuit may change a delay quantity applied to an external clock signal, and as a result the external clock signal may be not synchronized with an internal clock signal. When the external clock signal is not synchronized with the internal clock signal, the DLL circuit may perform a shift operation to compensate for the decrease in the internal supply voltage. Therefore, the external clock signal may be synchronized with the internal clock signal by the DLL circuit.

A DLL circuit employing a coarse loop and a fine loop may be used to lock clock signals of a semiconductor integrated circuit. However, a DLL circuit such as this may not be configured to lock clock signals of a semiconductor integrated circuit that may employ multi-phase clock signals.

Accordingly, there remains a need for a DLL circuit that may address one or more of these concerns.

SUMMARY OF THE INVENTION

Embodiments are therefore directed to a delay locked loop (DLL) circuit, a method of operating a DLL circuit and a semiconductor device employing a DLL circuit, which may overcome one or more of the disadvantages of the related art.

It is therefore a feature of an embodiment of the present invention to provide a DLL circuit employing a basic loop and a coarse loop.

It is another feature of another embodiment of the present invention to provide a method of operating a DLL circuit employing a basic loop and a coarse loop.

It is yet another feature of yet another embodiment of the present invention to provide a semiconductor device employing a DLL circuit, the DLL circuit employing a basic loop and a coarse loop.

At least one of the above and other features of the present invention may be realized by providing a DLL circuit having a basic loop configured to generate a plurality of first clock signals, wherein the plurality of first clock signals are generated based at least in part on an input clock signal, a feedback clock signal and a fine loop output signal, the plurality of first clock signals respectively having a phase difference, a coarse loop configured to generate a plurality of output clock signals, wherein the plurality of output clock signals are generated based at least in part on the input clock signal, the feedback clock signal and at least a portion of the plurality of first clock signals, the output clock signals respectively having a phase difference, a delay model configured to generate the feedback clock signal by delaying one of the output clock signals by a first time period, and a fine loop configured to generate the fine loop output signal, based at least in part on the input clock signal and the feedback clock signal.

The DLL circuit may include an output clock signal delayed by the delay model, and having a phase difference of zero degrees with respect to the input clock signal.

The plurality of output clock signals may include four clock signals respectively having a phase difference of ninety degrees.

The coarse loop may be deactivated and the fine loop may be activated if a phase of the input clock signal and a phase of the feedback clock signal correspond to a coarse-lock state.

The basic loop may include a phase detector configured to generate an up-signal or a down-signal, based at least in part on the input clock signal and the feedback clock signal, a charge pump configured to generate a charge current or a discharge current, based at least in part on the up-signal or the down-signal, a loop filter configured to integrate the charge current or the discharge current to generate a delay control signal, and a multi-phase voltage-controlled delay line configured to generate the first clock signals based at least in part on the delay control signal and the fine loop output signal, the first clock signals respectively having a phase difference.

The first clock signals may include eight clock signals respectively having a phase difference of forty five degrees.

The multi-phase voltage-controlled delay line may include a plurality of unit delay cells, wherein the plurality of unit delay cells are cascade-connected and are configured to delay respective input signals by a second time based at least in part on the delay control signal to output the delayed signals.

The basic loop may include a phase detector configured to generate a left-shifted signal or a right-shifted signal, based at least in part on the input clock signal and the feedback clock signal, a shift register configured to generate a plurality of delay control bits, based at least in part on the left-shifted signal or the right-shifted signal, and a multi-phase voltage-controlled delay line configured to generate the first clock signals, based at least in part on the delay control bits and the fine loop output signal, the first clock signals respectively having a phase difference.

The first clock signals may include eight clock signals respectively have a phase difference of forty five degrees.

The coarse loop may include a phase detector configured to generate an up-signal or a down-signal, based at least in part on the input clock signal and the feedback clock signal, a control circuit configured to generate a plurality of selection control signals, based at least in part on the up-signal or the down-signal, the selection control signals respectively having a phase difference, and a selection circuit configured to generate the output clock signals in response to the selection control signals and the first clock signals.

The control circuit may include a counter configured to count the up-signal or the down-signal to generate a first control signal having N bits, and a decoding circuit configured to decode the first control signal to output the selection control signals having the 2N bits.

The selection control signals may include four signals respectively having eight bits, the eight bits having enable positions which are respectively different.

The decoding circuit may include a first decoder configured to decode the first control signal to generate a first selection control signal of which a first bit corresponds to an enable state and rest bits correspond to a disable state, a second decoder configured to decode the first control signal to generate a second selection control signal of which a third bit corresponds to an enable state and rest bits correspond to a disable state, a third decoder configured to decode the first control signal to generate a third selection control signal of which a fifth bit corresponds to an enable state and rest bits correspond to a disable state, and a fourth decoder configured to decode the first control signal to generate a fourth selection control signal of which a seventh bit corresponds to an enable state and remaining bits correspond to a disable state.

The selection circuit may include a first multiplexer configured to select one of the first clock signals in response to the first selection control signal to output a first output clock signal, a second multiplexer configured to select one of the first clock signals in response to the second selection control signal to output a second output clock signal having a phase difference of ninety degrees with respect to the first output clock signal, a third multiplexer configured to select one of the first clock signals in response to the third selection control signal to output a third output clock signal having a phase difference of one hundred eighty degrees with respect to the first output clock signal, and a fourth multiplexer configured to select one of the first clock signals in response to the fourth selection control signal to output a fourth output clock signal having a phase difference of two hundreds seventy degrees with respect to the first output clock signal.

The fine loop may include a phase detector configured to generate an up-signal or a down-signal, based at least in part on the input clock signal and the feedback clock signal, a charge pump configured to generate a charge current or a discharge current in response to the up-signal or the down-signal, a loop filter configured to perform a filtering operation on the charge current or the discharge current to generate a delay control signal, and a voltage-controlled delay line configured to delay the input clock signal in response to the delay control signal by a first time to generate the fine loop output signal.

The fine loop may include a phase detector configured to generate a left-shifted signal or a right-shifted signal, based at least in part on the input clock signal and the feedback clock signal, a shift register configured to generate a plurality of delay control bits, based at least in part on the left-shifted signal or the right-shifted signal, and a voltage-controlled delay line configured to delay the input clock signal in response to the delay control bits by a first time to generate the fine loop output signal.

The DLL circuit may further include a lock detection circuit configured to generate a lock detection signal based at least in part on the first clock signals.

The coarse loop and the fine loop may be respectively activated or deactivated in response to the lock detection signal.

The coarse loop may be deactivated and the fine loop may be activated if the lock detection signal corresponds to an enable state.

The DLL circuit may further include a clock buffer configured to perform a buffering operation on the output clock signals to generate a plurality of internal clock signals.

The first time of the delay model may correspond to a delay time of the clock buffer.

At least one other of the above and other features and advantages of the present invention may be realized by providing a semiconductor memory device having a memory cell array, a delay locked loop (DLL) circuit configured to generate a plurality of output clock signals by employing a coarse loop, the plurality of output clock signals respectively having a phase difference, perform a feedback operation on one of the output clock signals by employing a fine loop to generate a fine loop output signal, and generate an internal clock signal synchronized with the input clock signal and having a phase, and an input/output circuit configured to receive a first data signal from an external device in response to the internal clock signal, provide the received first data signal to the memory cell array, receive a second data signal from the memory cell array and provide the received second data signal to the external device.

The output clock signals may include four clock signals respectively having a phase difference of ninety degrees.

The DLL circuit may deactivate the coarse loop and activates the fine loop if a phase of the input clock signal and a phase of the feedback clock signal correspond to a coarse-lock state.

At least one other of the above and other features and advantages of the present invention may be realized by providing a method of controlling delay locked loop (DLL), including generating a plurality of first clock signals, based at least in part on an input clock signal, a feedback clock signal and a fine loop output signal, the first clock signals respectively having a phase difference, generating a plurality of output clock signals, based at least in part on the input clock signal, the feedback clock signal and the first clock signals, the output clock signals respectively having a phase difference, generating the feedback clock signal by delaying one of the output clock signals by a first time period, and generating the fine loop output signal, based at least in part on the input clock signal and the feedback clock signal.

The first time period may correspond to a delay time of an output clock signal having a phase difference of zero degree with respect to the input clock signal.

The output clock signals may include four clock signals respectively having a phase difference of ninety degrees.

The coarse loop may be deactivated and the fine loop may be activated if a phase of the input clock signal and a phase of the feedback clock signal correspond to a coarse-lock state.

Generating the first clock signals may include generating an up-signal or a down-signal, based at least in part on the input clock signal and the feedback clock signal, generating a charge current or a discharge current, based at least in part on the up-signal or the down-signal, generating a delay control signal by performing a filtering operation on the charge current or the discharge current, and generating the first clock signals, based at least in part on the delay control signal and the fine loop output signal, the first clock signals respectively having a phase difference.

Generating the output clock signals may include generating an up-signal or a down-signal, based at least in part on the input clock signal and the feedback clock signal, generating a plurality of selection control signals respectively having the first phase difference, based at least in part on the up-signal or the down-signal, and generating the output clock signals, based at least in part on the selection control signals and the first clock signals.

Generating the fine loop output signal may include generating an up-signal or a down-signal, based at least in part on the input clock signal and the feedback clock signal, generating a charge current or a discharge current, based at least in part on the up-signal or the down-signal, generating a delay control signal by integrating the charge current or the discharge current, and generating the fine loop output signal by delaying the input clock signal by a first time in response to the delay control signal.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 2006-105479 filed on Oct. 30, 2006 in the Korean Intellectual Property Office (KIPO), and entitled: "Delay Locked Loop Circuit, Semiconductor Device Having the Same and Method of Controlling the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set fourth herein. Rather, these embodiments are provided so that this disclosure will be thorough and complete, and will fully convey the scope of the invention to those skilled in the art.

In the accompanying drawings, dimensions may be exaggerated for clarity of illustration. Furthermore, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

Additionally, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Figure 1:
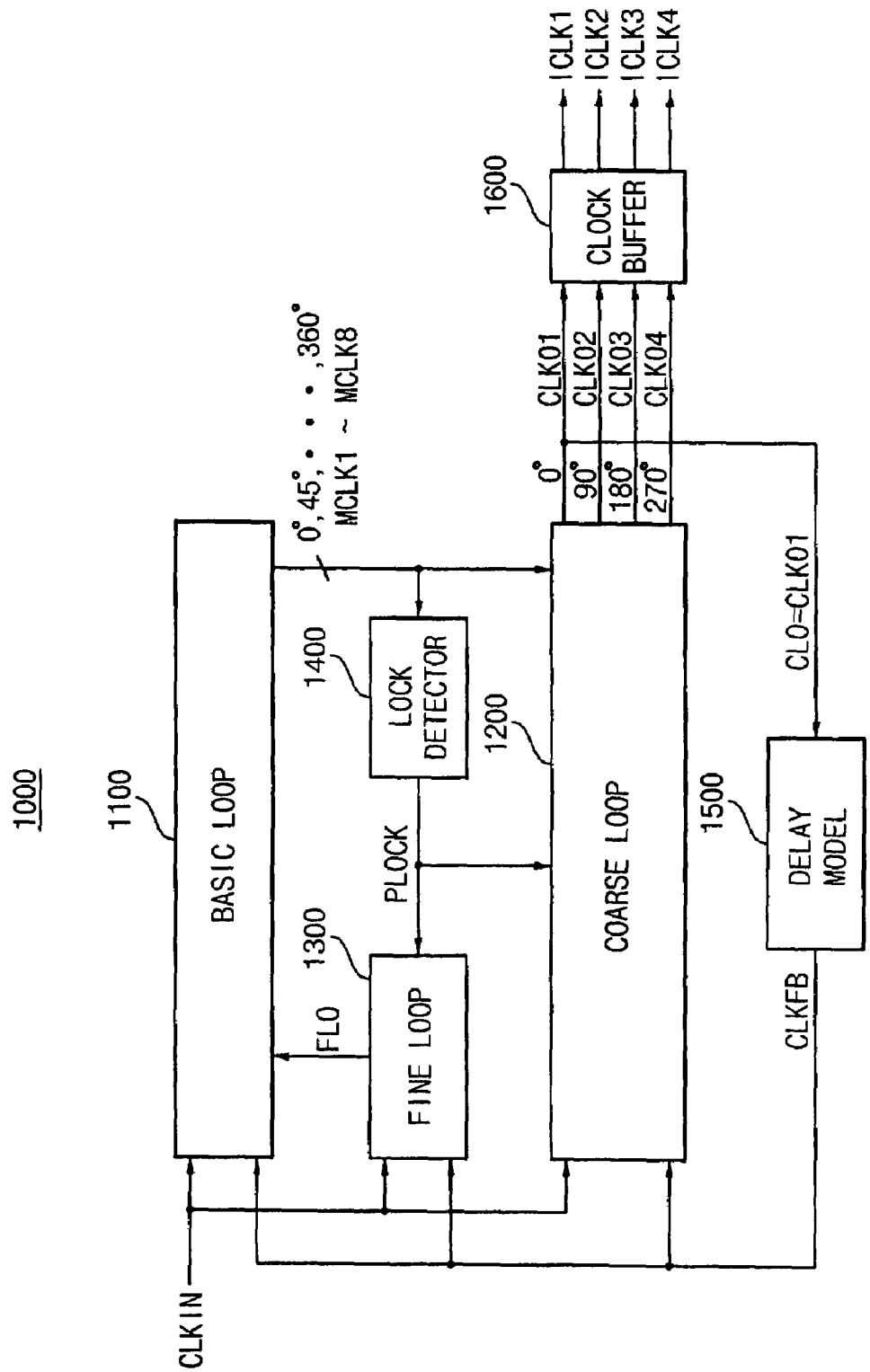
FIG. 1 illustrates a block diagram of a dual-loop delay locked loop (DLL) circuit according to an embodiment of the present invention.

FIG. 1 illustrates a block diagram of a dual-loop delay locked loop (DLL) circuit according to an example of the present invention. As shown in FIG. 1, the dual-loop DLL circuit 1000 may include a basic loop 1100, a coarse loop 1200, a delay model 1500, a fine loop 1300, a lock detector 1400 and a clock buffer 1600. In operation, the basic loop 1100 may generate a plurality of first clock signals MCLK1-MCLK8, based at least in part on an input clock signal CLKIN, a feedback clock signal CLKFB and a fine loop output signal FLO. The first clock signals MCLK1-MLCK8 respectively may have a different phase. The coarse loop 1200 may generate a plurality of output clock signals CLK01-CLK04, based at least in part on the input clock signal CLKIN, the feedback clock signal CLKFB and the first clock signals MCLK1-MLCK8. The output clock signals CLK01-CLK04 respectively may have a phase difference of ninety degrees. The delay model 1500 may delay the output signal CLO of the coarse loop 1200 by a first time to generate the feedback clock signal. The output signal CLO of the coarse loop 1200 may be one of the output clock signals CLK01-CLK04. For example, the first clock signal CLK01 may be provided to the delay model 1500 in FIG. 1. The fine loop 1300 may generate the fine loop output signal FLO, based at least in part on the input clock signal CLKIN and the feedback clock signal CLKFB. The lock detector 1400 may generate a lock detection signal PLOCK, based at least in part on the first clock signals MCLK1-MCLK8. The clock buffer 1600 may perform a buffering operation on the output clock signals CLK01-CLK04 to generate a plurality of internal clock signals ICLK1 through ICLK4.

Figure 2:
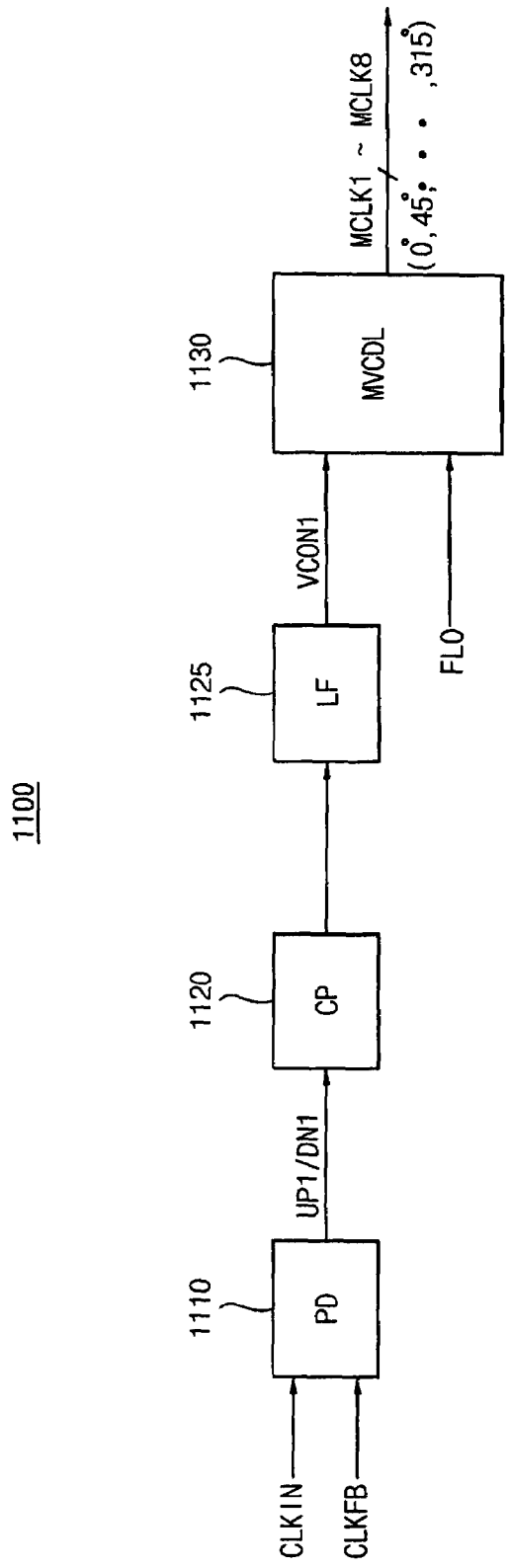
FIG. 2 illustrates a block diagram of a basic loop in the dual-loop DLL circuit of FIG. 1 according to an embodiment of the present invention.

FIG. 2 illustrates a block diagram of one example of the basic loop in the dual-loop DLL circuit of FIG. 1. As shown in FIG. 2, the basic loop 1100 may include a phase detector 1110, a charge pump 1120, a loop filter 1125 and a multi-phase voltage-controlled delay line 1130. In operation, the phase detector 1110 may generate an up-signal UP1 or a down-signal DN1, based at least in part on the input clock signal CLKIN and the feedback clock signal CLKFB. The charge pump 1120 may generate a charge current or a discharge current in response to the up-signal UP1 or the down-signal DN1. The loop filter 1125 may integrate the charge current or the discharge current to generate a delay control signal VCON1. The multi-phase voltage-controlled delay line 1130 may generate the first clock signals MCLK1 through MCLK8, based at least in part on the delay control signal and the fine loop output signal FLO. The first clock signals MCLK1 through MCLK8 may respectively have a phase difference of forty five degrees.

The basic loop 1100 illustrated in FIG. 2 may change a magnitude of the delay control signal VCON1 in response to a phase difference between the input clock signal CLKIN and the feedback clock signal CLKFB. For example, when a phase of the feedback clock signal CLKFB lags a phase of the input clock signal CLKIN, the dual-loop DLL circuit 1000 may decrease the magnitude of the delay control signal VCON1 and when the phase of the feedback clock signal CLKFB leads the phase of the input clock signal CLKIN, the dual-loop DLL circuit 1000 may increase the magnitude of the delay control signal VCON1.

The multi-phase voltage-controlled delay line 1130 may delay the fine loop output signal FLO in response to the delay control signal VCON1 to generate the first clock signals MCLK1 through MCLK8. The first bit MCLK1 among the first clock signals MCLK1 through MCLK8 may be a signal having a phase identical to a phase of the fine loop output signal FLO. The second bit MCLK2 among the first clock signals MCLK1 through MCLK8 may be a signal having a phase difference of forty five degrees with respect to the fine loop output signal FLO. The third bit MCLK3 among the first clock signals MCLK1 through MCLK8 may be a signal having a phase difference of ninety degrees with respect to the fine loop output signal FLO. The fourth bit MCLK4 among the first clock signals MCLK1 through MCLK8 may be a signal having a phase difference of one hundred thirty five degrees with respect to the fine loop output signal FLO. The fifth bit MCLK5 among the first clock signals MCLK1 through MCLK8 may be a signal having a phase difference of one hundred eighty degrees with respect to the fine loop output signal FLO. The sixth bit MCLK6 among the first clock signals MCLK1 through MCLK8 may be a signal having a phase difference of two hundred twenty five degrees with respect to the fine loop output signal FLO. The seventh bit MCLK7 among the first clock signals MCLK1 through MCLK8 may be a signal having a phase difference of two hundred seventy degrees with respect to the fine loop output signal FLO. The eighth bit MCLK8 among the first clock signals MCLK1 through MCLK8 may be a signal having a phase difference of three hundred fifteen degrees with respect to the fine loop output signal FLO.

Figure 3:
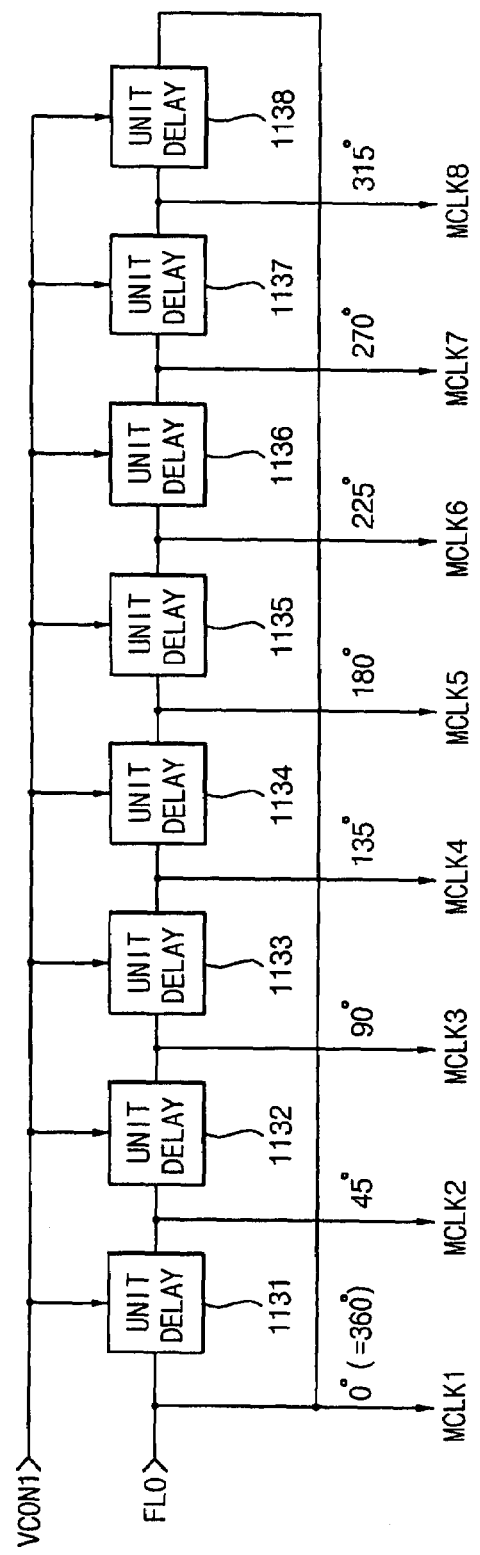
FIG. 3 illustrates a block diagram of a multi-phase voltage-controlled delay line in the basic loop of FIG. 2 according to an embodiment of the present invention.

FIG. 3 illustrates a block diagram of one example of the multi-phase voltage-controlled delay line in the basic loop of FIG. 2. As shown in FIG. 3, the multi-phase voltage-controlled delay line 1130 may include eight unit delay cells 1131 through 1138. In this embodiment, the eight unit delay cells 1131 through 1138 are cascade-connected, and delay respective input signals in response to the delay control signal VCON1 by a predetermined time to output the delayed signals. However, other configurations are within the scope of at least one embodiment.

The first bit MCLK1 of the first clock signals MCLK1 through MCLK8 may be a signal having a phase difference of zero degrees (or three hundred sixty degrees) with respect to the fine loop output signal FLO. The unit delay cell 1131 may receive the fine loop output signal FLO, and delay the fine loop output signal FLO by forty five degrees in response to the delay control signal VCON1 to generate the second bit MCLK2 of the first clock signals MCLK1 through MCLK8. The unit delay cell 1132 may receive the output signal of the unit delay cell 1131, and delay the output signal of the unit delay cell 1131 by forty five degrees in response to the delay control signal VCON1 to generate the third bit MCLK3 of the first clock signals MCLK1 through MCLK8. The unit delay cell 1133 may receive the output signal of the unit delay cell 1132, and delay the output signal of the unit delay cell 1132 by forty five degrees in response to the delay control signal VCON1 to generate the fourth bit MCLK4 of the first clock signals MCLK1 through MCLK8. The unit delay cell 1134 may receive the output signal of the unit delay cell 1133, and delay the output signal of the unit delay cell 1133 by forty five degrees in response to the delay control signal VCON1 to generate the fifth bit MCLK5 of the first clock signals MCLK1 through MCLK8. The unit delay cell 1135 may receive the output signal of the unit delay cell 1134, and delay the output signal of the unit delay cell 1134 by forty five degrees in response to the delay control signal VCON1 to generate the sixth bit MCLK6 of the first clock signals MCLK1 through MCLK8. The unit delay cell 1136 may receive the output signal of the unit delay cell 1135, and delay the output signal of the unit delay cell 1135 by forty five degrees in response to the delay control signal VCON1 to generate the seventh bit MCLK7 among the first clock signals MCLK1 through MCLK8. The unit delay cell 1137 may receive the output signal of the unit delay cell 1136, and delay the output signal of the unit delay cell 1136 by forty five degrees in response to the delay control signal VCON1 to generate the eighth bit MCLK8 of the first clock signals MCLK1 through MCLK8. The unit delay cell 1138 may receive the output signal of the unit delay cell 1137, and delay the output signal of the unit delay cell 1137 by forty five degrees in response to the delay control signal VCON1 to generate the first clock signal MCLK1. Furthermore, the output signal of unit delay cell 1138 may be provided to an input terminal of the unit delay cell 1131.

Figure 4:
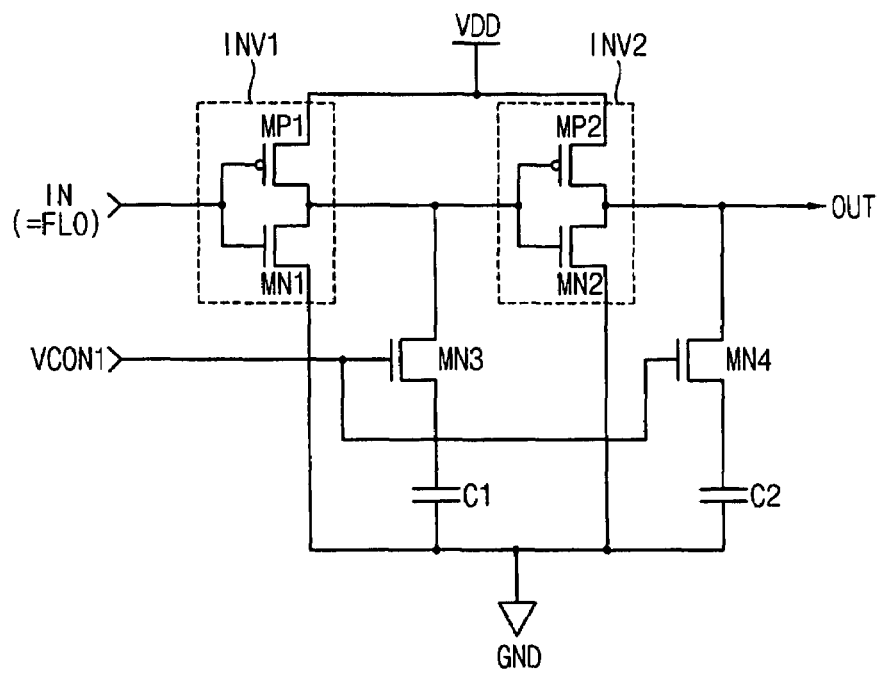
FIG. 4 illustrates a circuit diagram of a unit delay cell in the multi-phase voltage-controlled delay line of FIG. 3 according to an embodiment of the present invention.

FIG. 4 illustrates a circuit diagram of one example of the unit delay cell in the multi-phase voltage-controlled delay line of FIG. 3. As shown in FIG. 4, the unit delay cell 1131 may include inverters INV1 and INV2, n-channel metal oxide semiconductor (NMOS) transistors MN3 and MN4, and capacitors C1 and C2. The inverter INV1 includes a p-channel metal oxide semiconductor (PMOS) transistor MP1 and an NMOS transistor MN1 and the inverter INV2 includes a PMOS transistor MP2 and an NMOS transistor MN2. In operation, the inverter INV1 may invert an input signal IN and the inverter INV2 may invert an output signal of the inverter INV1 to generate an output signal OUT. The NMOS transistor MN3 may include a gate to which the delay control signal VCON1 may be applied and a drain coupled to an output terminal of the inverter INV1. The NMOS transistor MN4 may include a gate to which the delay control signal VCON1 may be applied and a drain coupled to an output terminal of the inverter INV2. The capacitor C1 may be coupled between a source of the NMOS transistor MN3 and a ground voltage GND and the capacitor C2 is coupled between a source of the NMOS transistor MN4 and the ground voltage GND.

Continuing with FIG. 4, when the magnitude of the delay control signal VCON1 increases, the NMOS transistors MN3 and MN4 may be turned on, and the capacitors C1 and C2 may be respectively electrically connected to the output terminals of the inverters INV1 and INV2. Therefore, delay quantity of the unit delay cell 1131 increases. Alternatively, if the magnitude of the delay control signal VCON1 decreases, the NMOS transistors MN3 and MN4 may be turned off, and the capacitors C1 and C2 may be respectively electrically disconnected from the output terminals of the inverters INV1 and INV2. Therefore, delay quantity of the unit delay cell 1131 decreases. The input signal IN may be substantially equal to the fine loop output signal FLO of FIG. 1. Additionally, the output signal of the unit delay cell 1131 may have an identical phase to the input signal IN.

Figure 5:
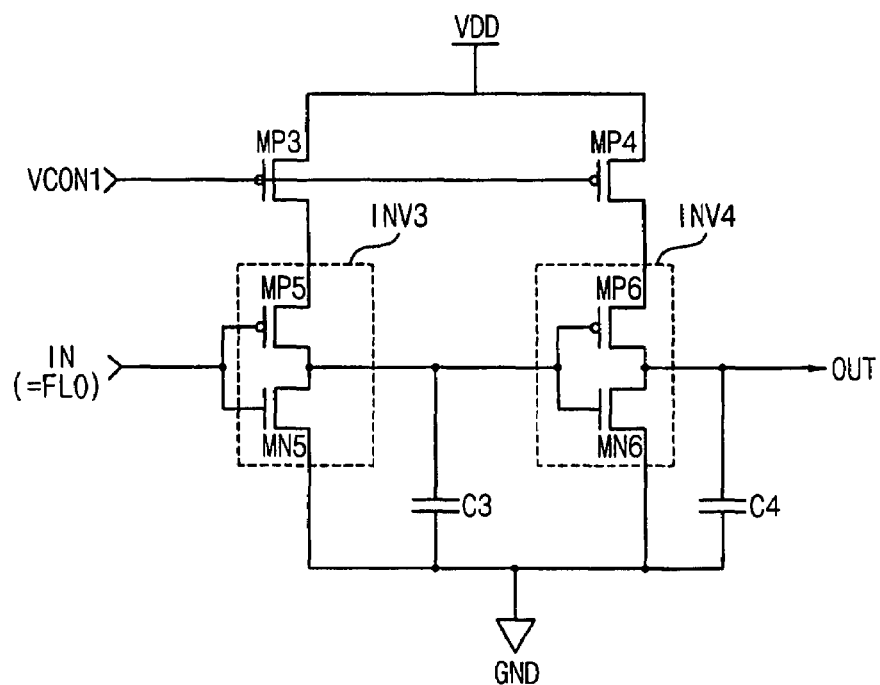
FIG. 5 illustrates a circuit diagram of a unit delay cell in the multi-phase voltage-controlled delay line of FIG. 3 according to another embodiment of the present invention.

FIG. 5 illustrates a circuit diagram of another example of the unit delay cell in the multi-phase voltage-controlled delay line of FIG. 3. As shown in FIG. 5, the unit delay cell 1131a may include inverters INV3 and INV4, PMOS transistors MP3 and MP4, and capacitors C3 and C4. The inverter INV3 may include a PMOS transistor MP5 and an NMOS transistor MN5, and the inverter INV4 may include a PMOS transistor MP6 and an NMOS transistor MN6. In operation, the inverter INV3 may invert an input signal IN and the inverter INV4 may invert an output signal of the INV3 to generate an output signal OUT. The PMOS transistor MP3 may include a gate to which the delay control signal VCON1 may be applied and a drain coupled to a source of the PMOS transistor MP5. The PMOS transistor MP4 may include a gate to which the delay control signal VCON1 may be applied and a drain coupled to a source of the PMOS transistor MP6. The capacitor C3 may be coupled between an output terminal of the inverter INV3 and a ground voltage GND, and the C4 may be coupled between an output terminal of the inverter INV4 and the ground voltage GND.

Continuing with FIG. 5, a current provided through the PMOS transistors MP3 and MP4 may decrease when the magnitude of the delay control signal VCON1 increases. Therefore, delay quantity of the unit delay cell 1131a may increase. Alternatively, a current provided through the PMOS transistors MP3 and MP4 may increase when the magnitude of the delay control signal VCON1 decreases. Therefore, delay quantity of the unit delay cell 1131a may decrease. In FIG. 5, the input signal IN may be substantially equal to the fine loop output signal FLO of FIG. 1. Additionally, the output signal of the unit delay cell 1131a may have an identical phase to the input signal IN.

Figure 6:
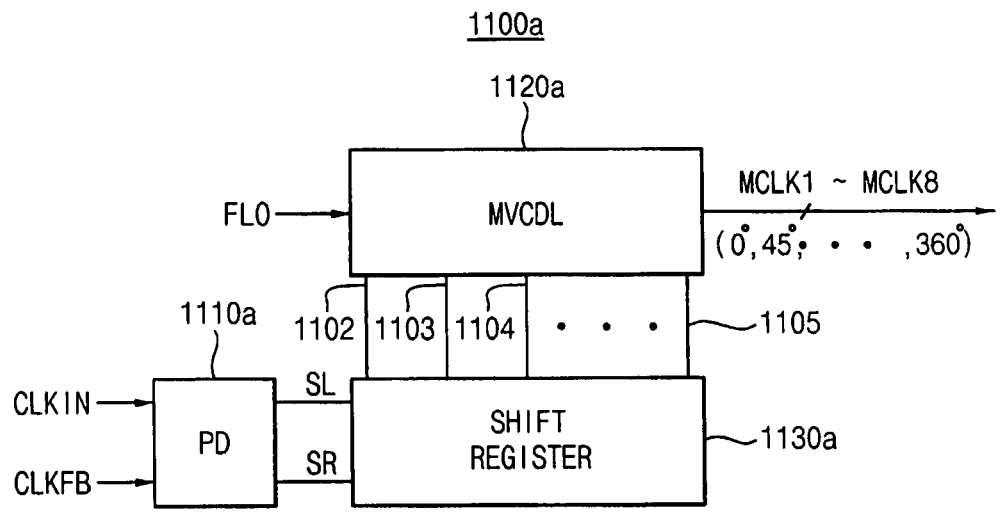
FIG. 6 illustrates a block diagram of a basic loop in the dual-loop DLL circuit of FIG. 1 according to an embodiment of the present invention.

FIG. 6 illustrates a block diagram of another example of the basic loop in the dual-loop DLL circuit 1000 of FIG. 4. As shown in FIG. 6, the basic loop 1100a may include a phase detector 1110a, a shift register 1130a and a multi-phase voltage-controlled delay line 1120a. In operation, the phase detector may generate a left-shifted signal SL or a right-shifted signal SR, based at least in part on the input clock signal CLKIN and the feedback clock signal CLKFB. The shift register 1130a may generate a plurality of delay control bits, based at least in part on the left-shifted signal SL or the right-shifted signal SR, and may provide the delay control bits to the multi-phase voltage-controlled delay line 1120a through control lines 1102 through 1105. The multi-phase voltage-controlled delay line 1120a may generate a plurality of first clock signals MCLK1 through MCLK8, based at least in part on the delay control bits and the fine loop output signal FLO. The first clock signals respectively may have a phase difference of forty five degrees.

In FIG. 6, the multi-phase voltage-controlled delay line 1120a may receive the delay control bits that are an output of the shift register 1130a through the control lines 1102 through 1105, and may delay the fine loop output signal FLO in response to the delay control bits to generate the first clock signals MCLK1 through MCLK8 having a multi phase.

Figure 7:
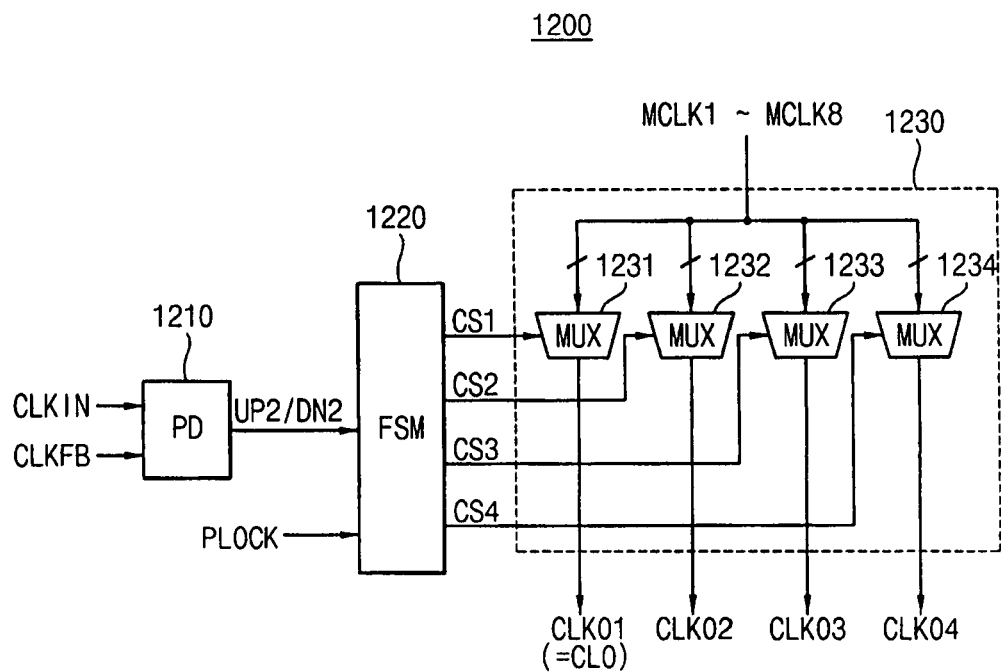
FIG. 7 illustrates a block diagram of a coarse loop in the dual-loop DLL circuit of FIG. 1 according to an embodiment of the present invention.

FIG. 7 illustrates a block diagram of one example of the coarse loop 1200 in the dual-loop DLL circuit 1000 of FIG. 1. As shown in FIG. 7, the coarse loop 1200 may include a phase detector 1210, a control circuit 1220 and a selection circuit. In operation, the phase detector 1210 may generate an up-signal UP2 or a down-signal DN2, based at least in part on the input clock signal CLKIN and the feedback signal CLKFB. The control circuit 1220 may generate a plurality of selection control signals CS1 through CS4, based at least in part on the up-signal UP2 or the down-signal DN2. Additionally, the control circuit 1220 is enabled in response to the lock detection signal PLOCK. The selection circuit 1230 may generate a plurality of first clock signals MCLK1 through MCLK8 in response to the selection control signals CS1 through CS4 and first clock signals MCLK1 through MCLK8.

The selection circuit 1230 may include multiplexers 1231 through 1234. The first multiplexer 1231 may select one of the first clock signals MCLK1 through MCLK8 in response to the first selection control signal CS1 to output the first output clock signal CLK01. The second multiplexer 1232 may select one of the first clock signals MCLK1 through MCLK8 in response to the second selection control signal CS2 to output the second output clock signal CLK02 having a phase difference of ninety degrees with respect to the first output clock signal CLK01. The third multiplexer 1233 may select one of the first clock signals MCLK1 through MCLK8 in response to the third selection control signal CS3 to output the third output clock signal CLK03 having a phase difference of one hundred eighty degrees with respect to the first output clock signal CLK01. The fourth multiplexer 1234 may select one of the first clock signals MCLK1 through MCLK8 in response to the fourth selection control signal CS4 to output the fourth output clock signal CLK04 having a phase difference of two hundreds seventy degrees with respect to the first output clock signal CLK01.

The coarse loop 1200 illustrated in FIG. 7 may generate the up-signal UP2 or the down-signal DN2 corresponding to a phase difference between the input clock signal CLKIN and the feedback clock signal CLKFB, and may generate the selection control signals CS1 through CS4 respectively having different phase, based at least in part on the up-signal UP2 or the down-signal DN2. Also, the coarse loop 1200 may generate the output clock signals CLK01 through CLK04 in response to the selection control signals CS1 through CS4 and the first clock signals MCLK1 through MCLK8. The first output clock signal CLK01 may be used as an input signal CLO of the delay model 1500 of FIG. 1.

Figure 8:
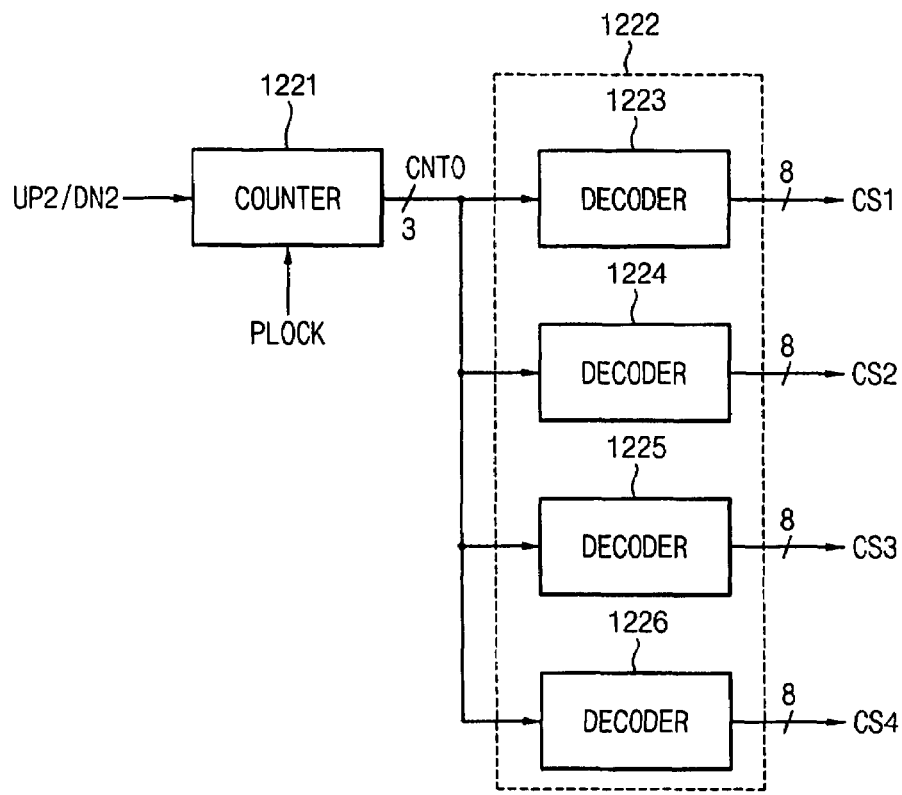
FIG. 8 illustrates a block diagram of a control circuit in the coarse loop of FIG. 7 according to an embodiment of the present invention.

FIG. 8 illustrates a block diagram of one example of the control circuit in the coarse loop of FIG. 7. As shown in FIG. 8, the control circuit 1220 may include a counter 1221 and a decoding circuit 1222. In operation, the counter 1221 may count the up-signal UP2 or the down-signal DN2, generate a first control signal CNT0 having three bits, and may be activated in response to the lock detection signal PLOCK. The decoding circuit 1222 may decode the first control signal CNT0 and output the selection control signals CS1 through CS4 respectively having eight bits.

The decoding circuit 1222 may include decoders 1223 through 1226. The first decoder 1223 may decode the first control signal CNT0 to generate the first selection control signal CS1 of which a first bit may be logic "1" and the remaining bits may be logic "0". The second decoder 1224 may decode the first control signal CNT0 to generate the second selection control signal CS2 of which a third bit may be logic "1" and the remaining bits may be logic "0". The third decoder 1225 may decode the first control signal CNT0 to generate the third selection control signal CS3, of which a fifth bit may be logic "1" and the remaining bits may be logic "0". The fourth decoder 1226 may decode the first control signal CNT0 to generate the fourth selection control signal CS4 of which a seventh bit may be logic "1" and the remaining bits may be logic "0".

Hereinafter, with reference to FIGS. 7 and 8, an operation of the coarse loop 1500 of FIG. 1 in accordance with an embodiment will be described.

In this embodiment, the output clock signals CLK01 through CLK04 may respectively have a phase difference of ninety degrees. For example, the second output clock signal CLK02 may have a phase difference of ninety degrees with respect to the first output clock signal CLK01, the third output clock signal CLK03 may have a phase difference of one hundred eighty degrees with respect to the first output clock signal CLK01 and the fourth output clock signal CLK04 may have a phase difference of two hundreds seventy degrees with respect to the first output clock signal CLK01.

The first clock signals MCLK1 through MCLK8 may respectively have a phase difference of forty five degrees. For example, the second bit MCLK2 may have a phase difference of forty five degrees with respect to the first bit MCLK1, the third bit MCLK3 may have a phase difference of ninety degrees with respect to the first bit MCLK1, the fourth bit MCLK4 may have a phase difference of one hundred thirty five degrees with respect to the first bit MCLK1, the fifth bit MCLK5 may have a phase difference of one hundred eighty degrees with respect to the first bit MCLK1, the sixth bit MCLK6 may have a phase difference of two hundreds twenty five degrees with respect to the first bit MCLK1, the seventh bit MCLK7 may have a phase difference of two hundreds seventy degrees with respect to the first bit MCLK1 and the eighth bit MCLK8 may have a phase difference of three hundreds fifteen degrees with respect to the first bit MCLK1.

In this embodiment, if the dual-loop DLL circuit 1000 is in a lock state, the first clock signal CLK01 may have a phase identical to the input clock signal CLKIN, the second clock signal CLK02 may have a phase difference of ninety degrees with respect to the input clock signal CLKIN, the third clock signal CLK03 may have a phase difference of one hundred eighty degrees with respect to the input clock signal CLKIN, the fourth clock signal CLK04 may have a phase difference of two hundreds seventy degrees with respect to the input clock signal CLKIN. The first control signal CNT0 may have three bits and may be one of 000, 001, 010, 011, 100, 101, 110 and 111.

The selection control signals CS1 through CS4 may respectively have eight bits. The first selection control signal CS1 may control the first multiplexer 1231, the second selection control signal CS2 may control the second multiplexer 1232, the third selection control signal CS3 may control the third multiplexer 1233 and the fourth selection control signal CS4 may control the fourth multiplexer 1234. The first clock signals MCLK1 through MCLK8 respectively having eight bits may be provided to an input terminal of respective multiplexers 1231 through 1234.

In this embodiment, if the first control signal CNT0 corresponds to 000, the first selection control signal CS1 may correspond to 10000000, the second selection control signal CS2 may correspond to 00100000, the third selection control signal CS3 may correspond to 00001000, and the fourth selection control signal CS4 may correspond to 00000010. In this example, the first multiplexer 1231 may output the first bit MCLK1 as the first output clock signal CLK01 in response to the first selection control signal CS1, the second multiplexer 1232 may output the third bit MCLK3 as the second output clock signal CLK02 in response to the second selection control signal CS2, the third multiplexer 1233 may output the fifth bit MCLK5 as the third output clock signal CLK03 in response to the third selection control signal CS3, and the fourth multiplexer 1234 may output the seventh bit MCLK7 as the fourth output clock signal CLK04 in response to the fourth selection control signal CS4.

In this embodiment, if the first control signal CNT0 corresponds to 001, the first selection control signal CS1 may correspond to 01000000, the second selection control signal CS2 may correspond to 00010000, the third selection control signal CS3 may correspond to 00000100, and the fourth selection control signal CS4 may correspond to 00000001. In this example, the first multiplexer 1231 may output the second bit MCLK2 as the first output clock signal CLK01 in response to the first selection control signal CS1, the second multiplexer 1232 may output the fourth bit MCLK4 as the second output clock signal CLK02 in response to the second selection control signal CS2, the third multiplexer 1233 may output the sixth bit MCLK6 as the third output clock signal CLK03 in response to the third selection control signal CS3, and the fourth multiplexer 1234 may output the eighth bit MCLK8 as the fourth output clock signal CLK04 in response to the fourth selection control signal CS4.

In this embodiment, if the first control signal CNT0 corresponds to 010, the first selection control signal CS1 may correspond to 00100000, the second selection control signal CS2 may correspond to 00001000, the third selection control signal CS3 may correspond to 00000010, and the fourth selection control signal CS4 may correspond to 10000000. In this example, the first multiplexer 1231 may output the third bit MCLK3 as the first output clock signal CLK01 in response to the first selection control signal CS1, the second multiplexer 1232 may output the fifth bit MCLK5 as the second output clock signal CLK02 in response to the second selection control signal CS2, the third multiplexer 1233 may output the seventh bit MCLK7 as the third output clock signal CLK03 in response to the third selection control signal CS3, and the fourth multiplexer 1234 may output the first bit MCLK1 as the fourth output clock signal CLK04 in response to the fourth selection control signal CS4.

In this embodiment, if the first control signal CNT0 corresponds to 011, the first selection control signal CS1 may correspond to 00010000, the second selection control signal CS2 may correspond to 00000100, the third selection control signal CS3 may correspond to 00000001, and the fourth selection control signal CS4 may correspond to 01000000. In this example, the first multiplexer 1231 may output the fourth bit MCLK4 as the first output clock signal CLK01 in response to the first selection control signal CS1, the second multiplexer 1232 may output the sixth bit MCLK6 as the second output clock signal CLK02 in response to the second selection control signal CS2, the third multiplexer 1233 may output the eighth bit MCLK8 as the third output clock signal CLK03 in response to the third selection control signal CS3, and the fourth multiplexer 1234 may output the second bit MCLK2 as the fourth output clock signal CLK04 in response to the fourth selection control signal CS4.

In this embodiment, if the first control signal CNT0 corresponds to 100, the first selection control signal CS1 may correspond to 00001000, the second selection control signal CS2 may correspond to 00000010, the third selection control signal CS3 may correspond to 10000000, and the fourth selection control signal CS4 may correspond to 00100000. In this example, the first multiplexer 1231 may output the fifth bit MCLK5 as the first output clock signal CLK01 in response to the first selection control signal CS1, the second multiplexer 1232 may output the seventh bit MCLK7 as the second output clock signal CLK02 in response to the second selection control signal CS2, the third multiplexer 1233 may output the first bit MCLK1 as the third output clock signal CLK03 in response to the third selection control signal CS3, and the fourth multiplexer 1234 may output the third bit MCLK3 as the fourth output clock signal CLK04 in response to the fourth selection control signal CS4.

In this embodiment, if the first control signal CNT0 corresponds to 101, the first selection control signal CS1 may correspond to 00000100, the second selection control signal CS2 may correspond to 00000001, the third selection control signal CS3 may correspond to 01000000, and the fourth selection control signal CS4 may correspond to 00010000. In this example, the first multiplexer 1231 may output the sixth bit MCLK6 as the first output clock signal CLK01 in response to the first selection control signal CS1, the second multiplexer 1232 may output the eighth bit MCLK8 as the second output clock signal CLK02 in response to the second selection control signal CS2, the third multiplexer 1233 may output the second bit MCLK2 as the third output clock signal CLK03 in response to the third selection control signal CS3 and the fourth multiplexer 1234 may output the fourth bit MCLK4 as the fourth output clock signal CLK04 in response to the fourth selection control signal CS4.

In this embodiment, if the first control signal CNT0 corresponds to 110, the first selection control signal CS1 may correspond to 00000010, the second selection control signal CS2 may correspond to 10000000, the third selection control signal CS3 may correspond to 00100000, and the fourth selection control signal CS4 may correspond to 00001000. In this example, the first multiplexer 1231 may output the seventh bit MCLK7 as the first output clock signal CLK01 in response to the first selection control signal CS1, the second multiplexer 1232 may output the first bit MCLK1 as the second output clock signal CLK02 in response to the second selection control signal CS2, the third multiplexer 1233 may output the third bit MCLK3 as the third output clock signal CLK03 in response to the third selection control signal CS3, and the fourth multiplexer 1234 may output the fifth bit MCLK5 as the fourth output clock signal CLK04 in response to the fourth selection control signal CS4.

In this embodiment, if the first control signal CNT0 corresponds to 111, the first selection control signal CS1 may correspond to 00000001, the second selection control signal CS2 may correspond to 01000000, the third selection control signal CS3 may correspond to 00010000, and the fourth selection control signal CS4 may correspond to 00000100. In this example, the first multiplexer 1231 may output the eighth bit MCLK8 as the first output clock signal CLK01 in response to the first selection control signal CS1, the second multiplexer 1232 may output the second bit MCLK2 as the second output clock signal CLK02 in response to the second selection control signal CS2, the third multiplexer 1233 may output the fourth bit MCLK4 as the third output clock signal CLK03 in response to the third selection control signal CS3, and the fourth multiplexer 1234 may output the sixth bit MCLK6 as the fourth output clock signal CLK04 in response to the fourth selection control signal CS4.

Figure 9:
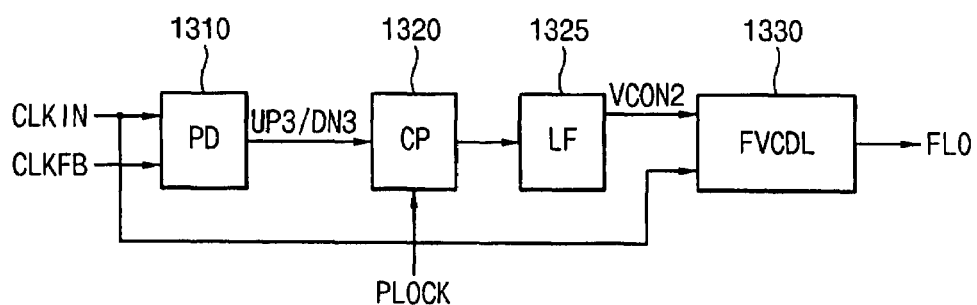
FIG. 9 illustrates a block diagram of a fine loop in the dual-loop DLL circuit of FIG. 1 according to an embodiment of the present invention.

FIG. 9 illustrates a block diagram of one example of the fine loop in the dual-loop DLL circuit of FIG. 1. As shown in FIG. 9, the fine loop 1300 may include a phase detector 1300, a charge pump 1320, a loop filter 1325 and a voltage-controlled delay line 1330. In operation, the phase detector 1310 may generate an up-signal UP3 or a down-signal DN3, based at least in part on the input clock signal CLKIN and the feedback clock signal CLKFB. The charge pump 1320 may generate a charge current or a discharge current in response to the up-signal UP3 or the down-signal DN3. Additionally, the charge pump 1320 may be activated in response to the lock detection signal PLOCK. The loop filter 1325 may integrate the charge current or the discharge current to generate a delay control signal VCON2. The voltage-controlled delay line 1330 may delay the input clock signal CLKIN by a predetermined time, based at least in part on the delay control signal VCON2, to generate the fine loop output signal FLO.

Figure 10:
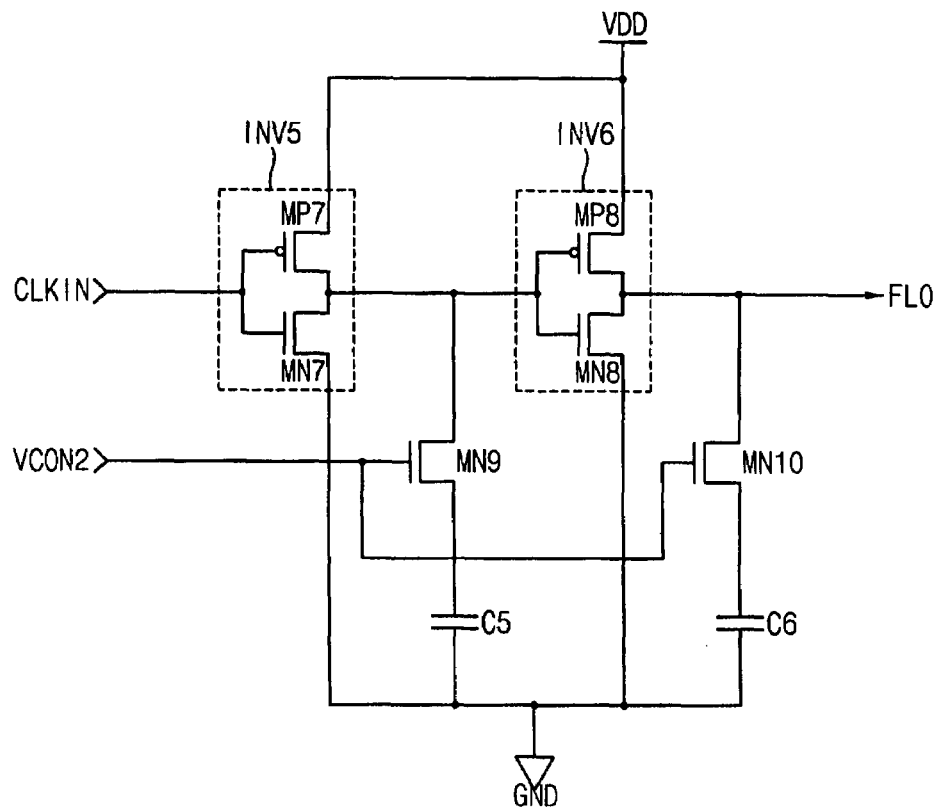
FIG. 10 illustrates a circuit diagram of a voltage-controlled delay line in the fine loop of FIG. 9 according to an embodiment of the present invention.

FIG. 10 illustrates a circuit diagram of one example of the voltage-controlled delay line in the fine loop of FIG. 9. As shown in FIG. 10, the voltage-controlled delay line 1330 may include inverters INV5 and INV6, NMOS transistors MN9 and MN10, and capacitors C5 and C6. The inverter INV5 may include a PMOS transistor MP7 and an NMOS transistor MN7, and inverter INV6 may include a PMOS transistor MP8 and an NMOS transistor MN8. In operation, the inverter INV5 may invert the input clock signal CLKIN and inverter INV6 may invert an output signal of the inverter INV5 to generate the fine loop output signal FLO. The NMOS transistor MN9 may include a gate to which the delay control signal VCON2 may be applied and a drain coupled to an output terminal of the inverter INV5. The NMOS transistor MN10 may include a gate to which the delay control signal VCON2 may be applied and a drain coupled to an output terminal of the inverter INV6. The capacitor C5 may be coupled between a source of the NMOS transistor MN9 and a ground voltage GND, and the capacitor C6 may be coupled between a source of the NMOS transistor MN10 and a ground voltage GND.

Hereinafter, with reference to FIGS. 9 and 10, an operation of the fine loop 1300 in FIG. 1 in accordance with another embodiment will be described.

The fine loop 1300 illustrated in FIG. 9 may generate the delay control signal VCON2, based at least in part on the input clock signal CLKIN and the feedback clock signal CLKFB, and may delay the input clock signal CLKIN in response to the delay control signal VCON2 to generate the fine loop output signal FLO. As illustrated in FIG. 10, a capacitance of the output terminals of the inverters INV5 and INV6 may change according to a magnitude of the delay control signal VCON2. For example, the capacitors C5 and C6 may be respectively electrically connected to the output terminals of the inverters INV5 and INV6 if the magnitude of the delay control signal VCON2 increases. Accordingly, the capacitance of the output terminals of the inverters INV5 and INV6 may increase, and the delay quantity of the voltage-controlled delay line 1330 may increase. On the contrary, the capacitors C5 and C6 may be respectively electrically disconnected from the output terminals of the inverters INV5 and INV6 if the magnitude of the delay control signal VCON2 decreases. Accordingly, the capacitance of the output terminals of the inverters INV5 and INV6 may decrease, and the delay quantity of the voltage-controlled delay line 1330 may decrease.

Figure 11:
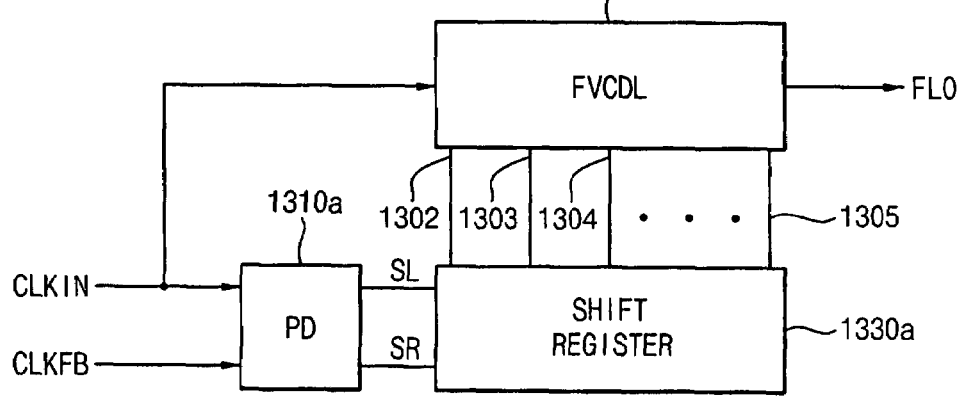
FIG. 11 illustrates a block diagram of a fine loop in the dual-loop DLL circuit of FIG. 1 according to an embodiment of the present invention.

FIG. 11 illustrates a block diagram of another example of the fine loop in the dual-loop DLL circuit of FIG. 1. As shown in FIG. 11, a fine loop 1300a may include a phase detector 1310a, a shift register 1330a and a voltage-controlled delay line 1320a. The phase detector 1310a may generate a left-shifted signal SL and a right-shifted signal SR, based at least in part on the input clock signal CLKIN and the feedback clock signal CLKFB. The shift register 1330a may generate a plurality of delay control bits, based at least in part on the left-shifted signal SL and the right-shifted signal SR, and provide the delay control bits to the voltage-controlled delay line 1320a through control lines 1302 through 1305. The voltage-controlled delay line 1320a may generate the fine loop output signal FLO, based at least in part on the delay control bits and the input clock signal CLKIN.

The voltage-controlled delay line 1320a may delay the input clock signal CLKIN in response to the delay control bits by a predetermined delay quantity. The delay quantity may be controlled according to the delay control bits. The left-shifted signal SL and the right-shifted signal SR may be generated by a phase detection operation of the phase detector 1310a, and when a phase of the input clock signal CLKIN is not identical to a phase of the feedback clock signal CLKFB, the fine loop may be activated.

Figure 12:
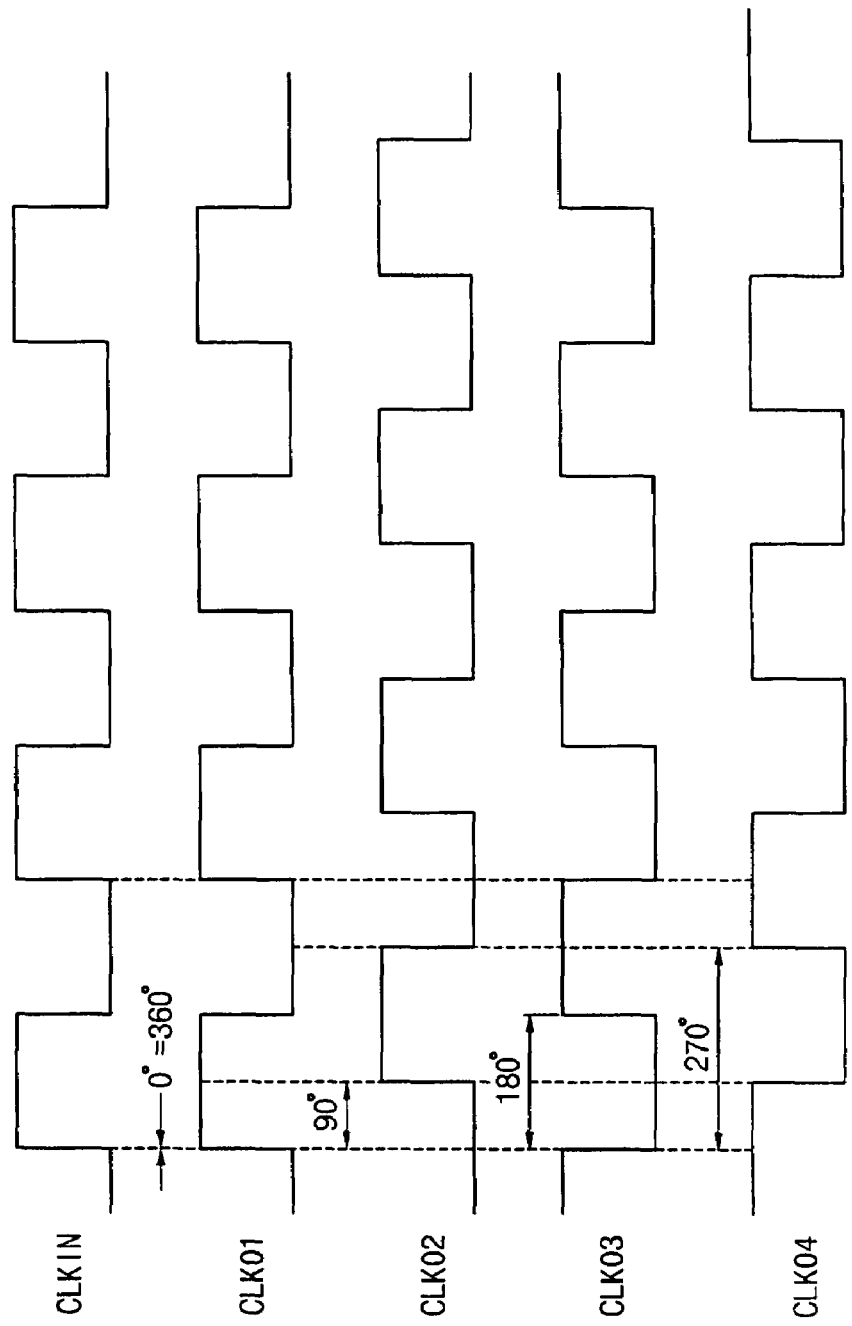
FIG. 12 illustrates a timing diagram of an output signal of the coarse loop in FIG. 7 according to an embodiment of the present invention.
Figure 13:
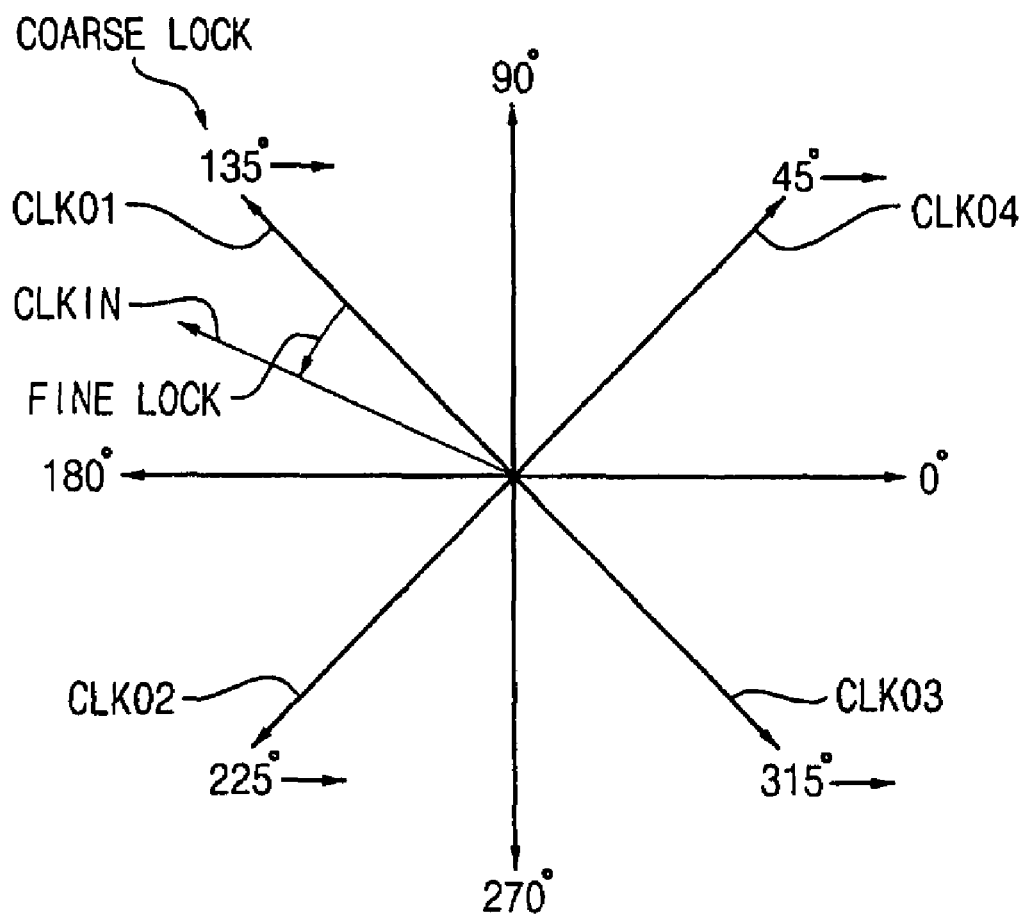
FIG. 13 illustrates a phase diagram of operation of the dual-loop DLL circuit in FIG. 1 according to an embodiment of the present invention.

FIG. 12 illustrates a timing diagram of an output signal of the coarse loop in FIG. 7. FIG. 13 illustrates a phase diagram for an operation of the dual-loop DLL circuit in FIG. 1.

Hereinafter, with reference to FIGS. 1 through 13, an operation of the dual-loop DLL circuit 1000 (Refer to FIG. 1) according to an example embodiment of the present invention will be described.

The dual-loop DLL circuit 1000 may receive the input clock signal CLKIN from an external device and generate internal clock signals ICLK1 through ICLK4 synchronized with the input clock signal CLKIN and respectively having a different phase. The internal clock signals ICLK1 through ICLK4 may be generated based at least in part on the output clock signals CLK01 through CLK04 that are output from a coarse loop 1200. An output clock signal, such as the first output clock signal CLK01 may be applied to the delay model 1500 as the input signal CLO of the delay model 1500. In FIG. 1, the first output clock signal CLK01 may be used as the input signal CLO of the delay model 1500. However, the input signal CLO of the delay model 1500 may be one of the output clock signals CLK01 through CLK04. Delay quantity of the delay model 1500 may correspond to delay time of the clock buffer 1600. The lock detector 1400 may generate the lock detection signal PLOCK, based at least in part on the first clock signals MCLK1 through MCLK8. The lock detection signal PLOCK may be enabled if the input clock signal CLKIN is synchronized with the feedback clock signal CLKFB, and the lock detection signal PLOCK may be disabled if the input clock signal CLKIN is not synchronized with the feedback clock signal CLKFB. If the lock detection signal PLOCK is in a disable state, the coarse loop 1200 may be activated and operated normally, and the fine loop 1300 may be deactivated. Alternatively, when the lock detection signal PLOCK is in an enable state, the coarse loop 1200 may be deactivated and the fine loop 1300 may be activated and operated normally.

The dual-loop DLL circuit 1000 may generate the first clock signals MCLK1 through MCLK8 having a multi-phase by employing the basic loop 1100, and may generate the output clock signals CLK01 through CLK04 by performing a coarse lock, using the coarse loop 1200. Next, a phase error between the input clock signal and the feedback clock signal CLKFB may be eliminated by using the fine loop 1300.

As illustrated in FIG. 12, if the input clock signal CLKIN is synchronized with the output clock signals CLK01 through CLK04, the first output clock signal CLK01 may have a phase difference of zero degree with respect to the input clock signal CLKIN, the second output clock signal CLK02 may have a phase difference of ninety degrees with respect to the input clock signal CLKIN, the third output clock signal CLK03 may have a phase difference of one hundred eighty degrees with respect to the input clock signal CLKIN, and the fourth output clock signal CLK04 may have a phase difference of two hundreds seventy degrees with respect to the input clock signal CLKIN. Referring to the phase diagram of FIG. 13, if a phase of the input clock signal CLKIN is in between one hundred thirty five degrees and one hundred eighty degrees and the coarse lock is performed, a phase of the output clock signal CLK01 may be one hundred thirty five degrees, a phase of the output clock signal CLK02 may be two hundreds twenty five degrees, a phase of the output clock signal CLK03 may be three hundreds fifteen degrees, a phase of the output clock signal CLK04 may be forty five degrees. If a fine lock is performed, the first output clock signal CLK01 having a phase of one hundred thirty five degrees may approach the input clock signal CLKIN.

Therefore, the dual-loop DLL circuit 1000 of FIG. 1 may generate the output clock signals CLK01 through CLK04 synchronized with the input clock signal CLKIN without a plurality of phase interpolators. Thus, the dual-loop DLL circuit 1000 may decrease a phase error, a size of the circuit and power consumption, as compared with a conventional DLL circuit. Also, the dual-loop DLL circuit 1000 may decrease jitter noise because the basic loop 1130 includes only one multi-phase voltage-controlled delay line 1130. The fine loop 1300 may eliminate a delay quantity less than or equal to forty five degrees that is not eliminated by the coarse loop 1200. In the dual-loop DLL circuit 1000, a delay quantity from the input clock signal CLKIN to the fourth clock signal CLK04 may correspond to about Tck+0.125 Tck. Here, Tck indicates one cycle of a clock signal. When the coarse lock is performed, the lock detector 1400 may deactivate the coarse loop 1200 and activate the fine loop 1300. After the coarse lock is performed, the fine loop 1300 may constantly operate so as to decrease an error occurred by an effect of a temperature and a power voltage.

Figure 14:
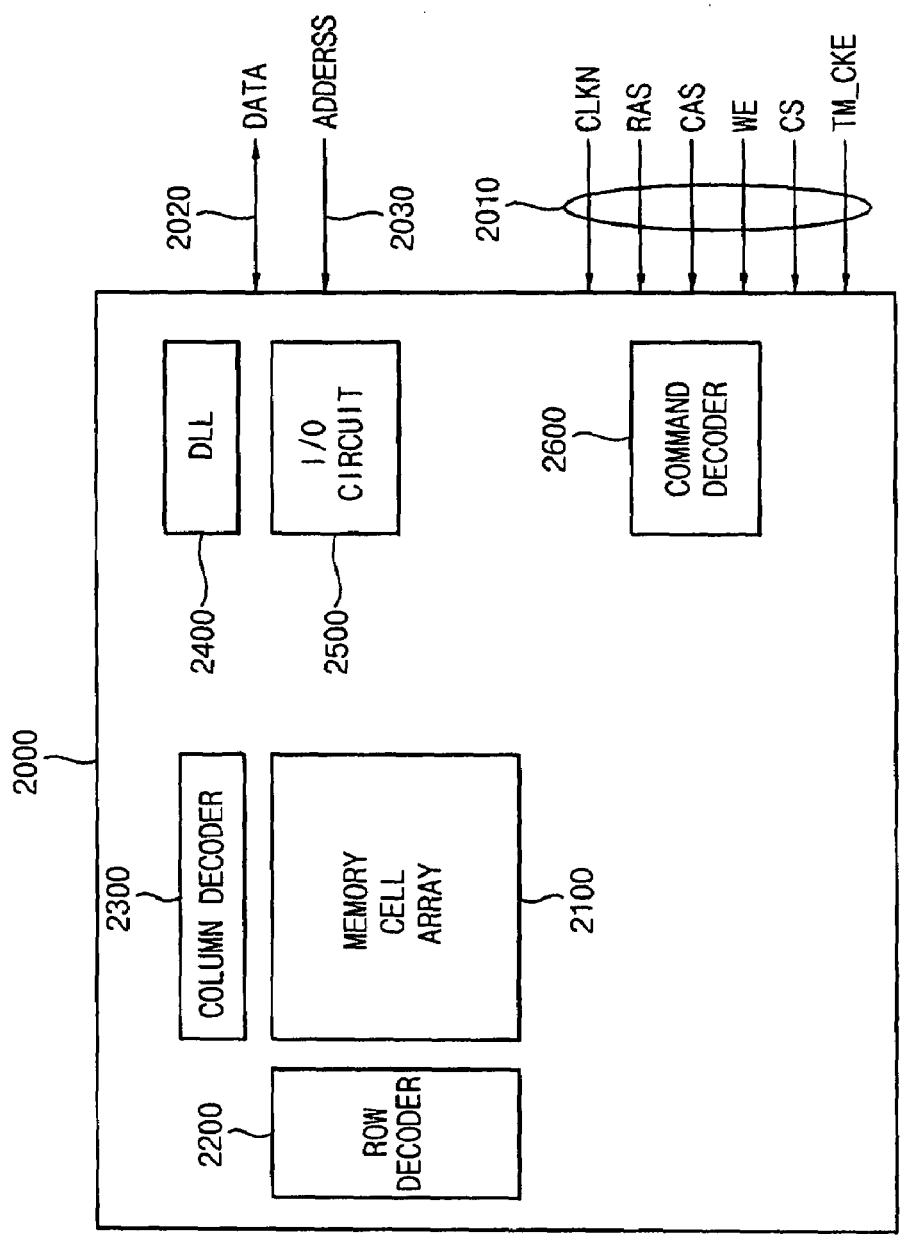
FIG. 14 illustrates a block diagram of a semiconductor memory device including a dual-loop DLL circuit according to an embodiment of the present invention.

FIG. 14 illustrates a block diagram of a semiconductor memory device including a dual-loop DLL circuit according to an example embodiment of the present invention. As shown in FIG. 14, a semiconductor memory device 2000 may include a memory cell array 2100, a row decoder 2200, a column decoder 2300, a dual-loop DLL circuit 2400, an input/output circuit 2500 and a command decoder 2600. The row decoder 2200 and the column decoder 2300 may provide access to a row and a column of the memory cell array 2100, respectively, in response to an address ADDRESS provided to an address bus 2030. A data DATA may be provided to the semiconductor memory device 2000 from an external device through a data bus 2020, or the data DATA may be provided to the external device from the semiconductor memory device 2000 through the data bus 2020. The input/output circuit 2500 may input the data to the semiconductor memory device 2000 from the external device or output the data to the external device from the semiconductor memory device 2000. The command decoder 2600 may receive control signals CLKN, RAS, CAS, WE, CS and TM_CKE, and may decode the control signals CLKN, RAS, CAS, WE, CS and TM_CKE to generate internal control signals. An operation mode, such as an active, a write, a read, a refresh and the like performed by the semiconductor memory device 2000, may be determined by the internal control signals. The dual-loop DLL circuit 2400 may generate a plurality of output clock signals by employing a coarse loop, the plurality of output clock signals respectively having a phase difference, may perform a feedback operation on one of the output clock signals, and may generate a plurality of internal clock signals, the plurality of internal clock signals respectively having a phase difference based at least in part on the output clock signals.

In the above, an embodiment wherein output clock signals respectively have a phase difference of ninety degrees is described. However, it is worthwhile to note that a dual-loop DLL circuit according to an example embodiment of the present invention is not limited to generate multi-phase clock signals having a phase difference of ninety degrees, and the dual-loop DLL circuit according to an example embodiment of the present invention may applied to a system of generating a multi-phase clock signals having a phase difference of forty five degrees or thirty degrees, as just a few further examples.

The DLL circuit according to example embodiments of the present invention may generate internal clock signals based at least in part on multi-phase output clock signals that are an output of a coarse loop. Furthermore, a DLL circuit according to example embodiments of the present invention may be implemented with relatively simple configuration, small size and low power consumption. A DLL circuit according to example embodiments of the present invention may also decrease jitter noise.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A delay locked loop (DLL) circuit comprising:
   a basic loop configured to generate a plurality of first clock signals, wherein the plurality of first clock signals are generated based at least in part on an input clock signal, a feedback clock signal and a fine loop output signal, the plurality of first clock signals respectively having a phase difference;
   a coarse loop configured to generate a plurality of output clock signals, wherein the plurality of output clock signals are generated based at least in part on the input clock signal, the feedback clock signal and at least a portion of the plurality of first clock signals, the output clock signals respectively having a phase difference;
   a delay model configured to generate the feedback clock signal by delaying one of the output clock signals by a first time period; and
   a fine loop configured to generate the fine loop output signal, based at least in part on the input clock signal and the feedback clock signal.

2. The DLL circuit as claimed in claim 1, wherein the output clock signal delayed by the delay model has a phase difference of zero degrees with respect to the input clock signal.

3. The DLL circuit as claimed in claim 1, wherein the output clock signals include four clock signals respectively having a phase difference of ninety degrees.

4. The DLL circuit as claimed in claim 1, wherein the coarse loop is deactivated and the fine loop is activated if a phase of the input clock signal and a phase of the feedback clock signal correspond to a coarse-lock state.

5. The DLL circuit as claimed in claim 1, wherein the basic loop comprises:
   a phase detector configured to generate an up-signal or a down-signal, based at least in part on the input clock signal and the feedback clock signal;
   a charge pump configured to generate a charge current or a discharge current, based at least in part on the up-signal or the down-signal;
   a loop filter configured to integrate the charge current or the discharge current to generate a delay control signal; and
   a multi-phase voltage-controlled delay line configured to generate the first clock signals based at least in part on the delay control signal and the fine loop output signal, the first clock signals respectively having a phase difference.

6. The DLL circuit as claimed in claim 5, wherein the first clock signals include eight clock signals respectively having a phase difference of forty five degrees.

7. The DLL circuit as claimed in claim 6, wherein the multi-phase voltage-controlled delay line includes a plurality of unit delay cells, wherein the plurality of unit delay cells are cascade-connected and are configured to delay respective input signals by a second time based at least in part on the delay control signal to output the delayed signals.

8. The DLL circuit as claimed in claim 1, wherein the basic loop comprises:
   a phase detector configured to generate a left-shifted signal or a right-shifted signal, based at least in part on the input clock signal and the feedback clock signal;
   a shift register configured to generate a plurality of delay control bits, based at least in part on the left-shifted signal or the right-shifted signal; and
   a multi-phase voltage-controlled delay line configured to generate the first clock signals, based at least in part on the delay control bits and the fine loop output signal, the first clock signals respectively having a phase difference.

9. The DLL circuit as claimed in claim 8, wherein the first clock signals includes eight clock signals respectively have a phase difference of forty five degrees.

10. The DLL circuit as claimed in claim 1, wherein the coarse loop comprises:
    a phase detector configured to generate an up-signal or a down-signal, based at least in part on the input clock signal and the feedback clock signal;
    a control circuit configured to generate a plurality of selection control signals, based at least in part on the up-signal or the down-signal, the selection control signals respectively having a phase difference; and
    a selection circuit configured to generate the output clock signals in response to the selection control signals and the first clock signals.

11. The DLL circuit as claimed in claim 10, wherein the control circuit comprises:
    a counter configured to count the up-signal or the down-signal to generate a first control signal having N bits; and
    a decoding circuit configured to decode the first control signal to output the selection control signals having the 2N bits.

12. The DLL circuit as claimed in claim 11, wherein the selection control signals include four signals respectively having eight bits, the eight bits having enable positions which are respectively different.

13. The DLL circuit as claimed in claim 12, wherein the decoding circuit comprises:
    a first decoder configured to decode the first control signal to generate a first selection control signal of which a first bit corresponds to an enable state and rest bits correspond to a disable state;
    a second decoder configured to decode the first control signal to generate a second selection control signal of which a third bit corresponds to an enable state and rest bits correspond to a disable state;
    a third decoder configured to decode the first control signal to generate a third selection control signal of which a fifth bit corresponds to an enable state and rest bits correspond to a disable state; and
    a fourth decoder configured to decode the first control signal to generate a fourth selection control signal of which a seventh bit corresponds to an enable state and remaining bits correspond to a disable state.

14. The DLL circuit as claimed in claim 13, wherein the selection circuit comprises:

a first multiplexer configured to select one of the first clock signals in response to the first selection control signal to output a first output clock signal;

a second multiplexer configured to select one of the first clock signals in response to the second selection control signal to output a second output clock signal having a phase difference of ninety degrees with respect to the first output clock signal;

a third multiplexer configured to select one of the first clock signals in response to the third selection control signal to output a third output clock signal having a phase difference of one hundred eighty degrees with respect to the first output clock signal; and a fourth multiplexer configured to select one of the first clock signals in response to the fourth selection control signal to output a fourth output clock signal having a phase difference of two hundreds seventy degrees with respect to the first output clock signal.

15. The DLL circuit as claimed in claim 1, wherein the fine loop comprises:

a phase detector configured to generate an up-signal or a down-signal, based at least in part on the input clock signal and the feedback clock signal;

a charge pump configured to generate a charge current or a discharge current in response to the up-signal or the down-signal;

a loop filter configured to perform a filtering operation on the charge current or the discharge current to generate a delay control signal; and a voltage-controlled delay line configured to delay the input clock signal in response to the delay control signal by a first time to generate the fine loop output signal.

16. The DLL circuit as claimed in claim 1, wherein the fine loop comprises:

a phase detector configured to generate a left-shifted signal or a right-shifted signal, based at least in part on the input clock signal and the feedback clock signal;

a shift register configured to generate a plurality of delay control bits, based at least in part on the left-shifted signal or the right-shifted signal; and a voltage-controlled delay line configured to delay the input clock signal in response to the delay control bits by a first time to generate the fine loop output signal.

17. The DLL circuit as claimed in claim 1, further comprising:

a lock detection circuit configured to generate a lock detection signal based at least in part on the first clock signals.

18. The DLL circuit as claimed in claim 17, wherein the coarse loop and the fine loop are respectively activated or deactivated in response to the lock detection signal.

19. The DLL circuit as claimed in claim 18, wherein the coarse loop is deactivated and the fine loop is activated if the lock detection signal corresponds to an enable state.

20. The DLL circuit as claimed in claim 1, further comprising:

a clock buffer configured to perform a buffering operation on the output clock signals to generate a plurality of internal clock signals.

21. The DLL circuit as claimed in claim 20, wherein the first time of the delay model corresponds to a delay time of the clock buffer.

22. A method of controlling delay locked loop (DLL), comprising:

generating a plurality of first clock signals, based at least in part on an input clock signal, a feedback clock signal and a fine loop output signal, the first clock signals respectively having a phase difference;

generating a plurality of output clock signals, based at least in part on the input clock signal, the feedback clock signal and the first clock signals, the output clock signals respectively having a phase difference;

generating the feedback clock signal by delaying one of the output clock signals by a first time period; and generating the fine loop output signal, based at least in part on the input clock signal and the feedback clock signal.

* * * * *